United States Patent
Tan

(10) Patent No.: US 11,652,087 B2
(45) Date of Patent: May 16, 2023

(54) INTERPOSER DESIGN IN PACKAGE STRUCTURES FOR WIRE BONDING APPLICATIONS

(71) Applicant: Tahoe Research, Ltd., Dublin (IE)

(72) Inventor: Aiping Tan, Shanghai (CN)

(73) Assignee: Tahoe Research, Ltd., Dublin (IE)

( * ) Notice: Subject to any disclaimer, the term of this patent is extended or adjusted under 35 U.S.C. 154(b) by 110 days.

(21) Appl. No.: 17/174,319

(22) Filed: Feb. 11, 2021

(65) Prior Publication Data

US 2021/0183819 A1 Jun. 17, 2021

Related U.S. Application Data

(62) Division of application No. 16/465,488, filed as application No. PCT/CN2016/113597 on Dec. 30, 2016, now Pat. No. 10,971,478.

(51) Int. Cl.
*H01L 25/065* (2023.01)
*H01L 23/498* (2006.01)
(Continued)

(52) U.S. Cl.
CPC .... *H01L 25/0657* (2013.01); *H01L 23/49811* (2013.01); *H01L 24/48* (2013.01);
(Continued)

(58) Field of Classification Search
CPC ........... H01L 25/0657; H01L 23/49811; H01L 24/48; H01L 25/18; H01L 25/50; H01L 2224/48157; H01L 2224/48225; H01L 2225/0651; H01L 2225/06517; H01L 2225/06527; H01L 2225/06562;
(Continued)

(56) References Cited

U.S. PATENT DOCUMENTS 8,198,728 B2 6/2012 Nishimura
9,842,831 B2 12/2017 Tsai
(Continued)

FOREIGN PATENT DOCUMENTS

CN 101378051 3/2009
CN 201311930 Y 9/2009
(Continued)

OTHER PUBLICATIONS

Office Action from Taiwan Patent Application No. 106139288, dated Sep. 28, 2021, 15 pgs.
(Continued)

*Primary Examiner* — Karen Kusumakar
(74) *Attorney, Agent, or Firm* — Studebaker & Brackett PC

(57) ABSTRACT

Methods of forming microelectronic package structures, and structures formed thereby, are described. Those methods/structures may include attaching a first die on a board, attaching an interposer on a top surface of the first die, and attaching a second die on the top surface of the first die that is adjacent the interposer, wherein the second die is offset from a center region of the first die. A first wire conductive structure may be attached to the second die that extends from the second die to a top surface of the interposer. A second wire conductive structure is attached to the interposer and extends from the interposer to the board.

19 Claims, 6 Drawing Sheets

(51) Int. Cl.
H01L 23/00 (2006.01)
H01L 25/18 (2023.01)
H01L 25/00 (2006.01)

(52) U.S. Cl.
CPC .............. *H01L 25/18* (2013.01); *H01L 25/50* (2013.01); *H01L 2224/48157* (2013.01); *H01L 2224/48225* (2013.01); *H01L 2225/0651* (2013.01); *H01L 2225/06517* (2013.01); *H01L 2225/06527* (2013.01); *H01L 2225/06562* (2013.01)

(58) Field of Classification Search
CPC . H01L 2225/06568; H01L 2224/16225; H01L 2224/48091; H01L 2224/48137; H01L 2224/48227; H01L 2224/48465; H01L 2224/4848; H01L 2924/15311; H01L 23/5385
See application file for complete search history.

(56) References Cited

U.S. PATENT DOCUMENTS

| | | |
|---|---|---|
| 2004/0159929 A1 | 8/2004 | Huschka et al. |
| 2007/0035002 A1 | 2/2007 | Moto et al. |
| 2008/0054491 A1 | 3/2008 | Makino et al. |
| 2012/0286409 A1 | 11/2012 | Shah |
| 2013/0015589 A1 | 1/2013 | Liao et al. |
| 2015/0048521 A1* | 2/2015 | Kwon ................ H01L 25/105 257/777 |

FOREIGN PATENT DOCUMENTS

| | | |
|---|---|---|
| CN | 204946895 | 1/2016 |
| CN | 106158818 | 11/2016 |

OTHER PUBLICATIONS

International Preliminary Report for International Patent Application No. PCT/CN2016/113597 dated Jul. 11, 2019, 5 pgs.
International Search Report and Written Opinion for International Patent Application No. PCT/CN2016/113597 dated Oct. 11, 2017, 6 pgs.
Notice of Allowance from Taiwan Patent Application No. 106139288, dated Mar. 21, 2022, 3 pgs.
Office Action from Taiwan Patent Application No. 106139288, dated Dec. 17, 2021, 12 pgs.

* cited by examiner

INTERPOSER DESIGN IN PACKAGE STRUCTURES FOR WIRE BONDING APPLICATIONS

CROSS-REFERENCE TO RELATED APPLICATION

This patent application is a divisional of U.S. patent application Ser. No. 16/465,488, filed May 30, 2019, entitled, "INTERPOSER DESIGN IN PACKAGE STRUCTURES FOR WIRE BONDING APPLICATIONS," which is a U.S. National Phase Application under 35 U.S.C. § 371 of International Application No. PCT/CN2016/113597, filed Dec. 30, 2016, entitled "INTERPOSER DESIGN IN PACKAGE STRUCTURES FOR WIRE BONDING APPLICATIONS," which designates the United States of America, the entire disclosure of which is hereby incorporated by reference in its entirety and for all purposes.

BACKGROUND OF THE INVENTION

Microelectronic package structures may be used to support various die/devices, such as computing devices and/or memory devices, for example. Packaging structures that may be employed in housing die can include hybrid packages, which can comprise a smaller, top die mounted on a larger, bottom die.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

Figure 1A:
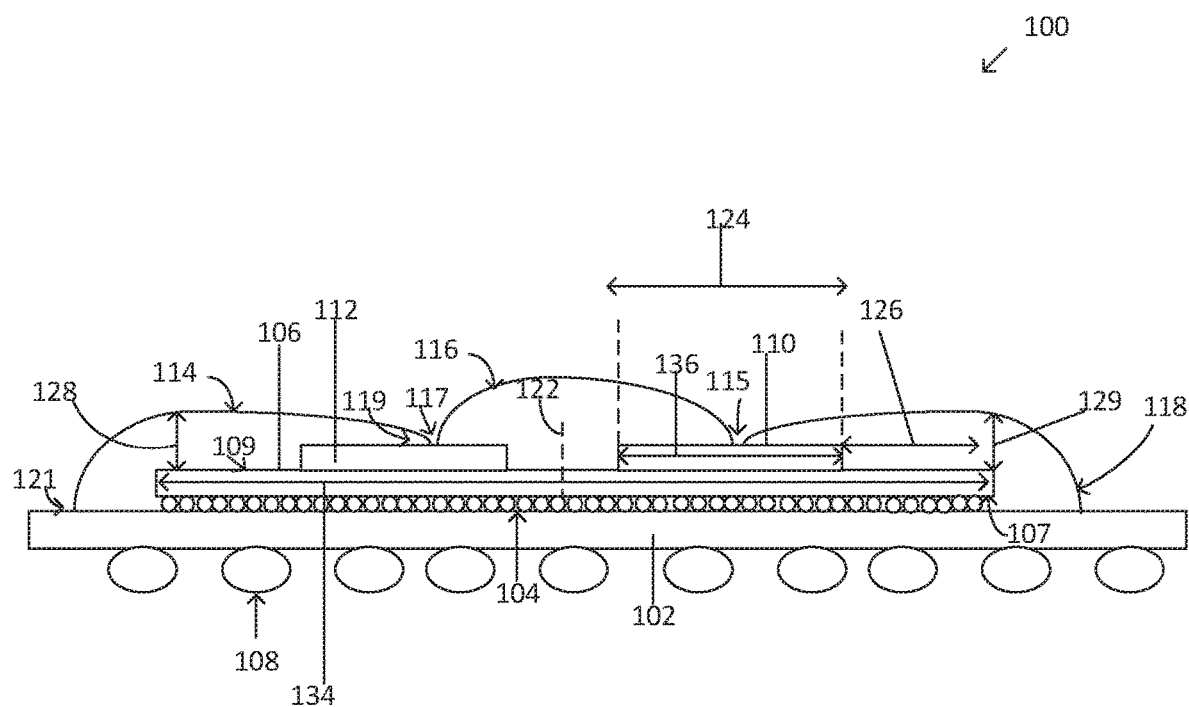
FIGS. 1a-1d represents cross-sectional views of structures according to embodiments.

DETAILED DESCRIPTION OF THE PRESENT INVENTION in the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between an electrical component, such a an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate including alternating layers of a dielectric material and metal—built-up around a core layer (either a dielectric or a metal core). In another embodiment, a substrate may comprise a careless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die may include a front-side and an opposing back-side. In some embodiments, the front-side may be referred to as the "active surface" of the die. A number of interconnects may extend from be die's front-side to the underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some one embodiment, a die may be disposed on a substrate in a flip-chip arrangement. In an embodiment interconnects comprises an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between a die and substrate). In some embodiments herein, a die may be coupled with a substrate by a number of interconnects in a flip-chip arrangement. However, in other embodiments, alternative structures and/or methods may be utilized to couple a die with a substrate.

Embodiments of methods of forming packaging structures, including methods of forming wire bonds on hybrid package structures, are described. Those methods/structures may include attaching a first die on a board, attaching an interposer on a top surface of the first die, attaching a second die on the top surface of the first die that is adjacent the interposer, wherein the second die is offset from a center region of the first die. A first wire conductive structure may be attached to the second die that extends from the second die to a top surface of the interposer. A second wire conductive structure is attached to the interposer that extends from the interposer to the board. The embodiments herein enable increased wire sweep performance and die edge clearance in hybrid packages.

FIGS. 1a-1d illustrate cross-sectional views of embodiments of fabricating package structures comprising an interposer that improves wire sweep in hybrid microelectronic packages, for example. In FIG. 1a (cross-sectional view), a portion of a package structure 100, such as a hybrid package 100, for example, is shown. In an embodiment, a substrate 102, may comprise a board such as a fiberglass reinforced epoxy laminated board that is flame retardant (FR4), for example. In another embodiment, the package substrate 102 may comprise a portion of a board, such as a printed circuit board (FOB board), for example, and in other embodiments, the substrate 102 may comprise a motherboard.

In an embodiment, a die 106, such as a microelectronic die, may be disposed on a top surface of the substrate 102, In an embodiment, the die 106, which may comprise a first die 106, may comprise a flip chip die. In other embodiments, the die 106 may comprise any type of microelectronic device, such as but not limited to a microprocessor, a graphics processor, a signal processor, a network processor, a chipset, etc. In one embodiment, the die 106 comprises a system on a chip (SOC) having multiple functional units (e.g., one or more processing units, one or more graphics units, one or more communications units, one or more signal processing units, one or more security units, etc.). However, it should be understood that the disclosed embodiments are not limited to any particular type or class of die/devices. The bottom surface 107 of the device/die 106 may be electrically and physically coupled with the substrate/board 102 by solder balls/conductive structures 104, The first die 106 may comprise a length 134.

Solder balls 108 may be disposed on a bottom surface of the substrate/board. An interposer 112 may be disposed on a top surface 109 of the die 106. The interposer 112 may comprise any suitable type of board/substrate, such as a FOB board for example, with which to route signals, for example. In an embodiment, the interposer 112 may comprise at least one bond pad on a top surface. In an embodiment, the interposer 112 may be offset from a center region/location 122 of the die 106. A second die 110 may be disposed on the top surface 109 of the die 106, and may be adjacent the interposer 112 on the top surface. In an embodiment, the second die 110 may comprise a memory die.

In other embodiments, the second die 110 may comprise any type of suitable die/device, according to the particular application. In an embodiment a footprint 124 of the second die 110 may be offset from the center location 122 of the first die 106. A peripheral edge of the second die 110 may be located a distance 126 from an end portion of the die 106.

The second die 110 may comprise a length 136. In an embodiment, the first die 106 may comprise a length 134 that is greater than about twice the length 136 of the second die 110.

A first wire conductive structure 116 may be disposed/attached to the second die 110. The first wire conductive structure 116 may comprise a wire structure, in an embodiment, and may be bonded to a top surface of the second die 110 by bond, such as a ball bond, in an embodiment. The ball bond may comprise gold, copper, or silver, in an embodiment, and the wires structures herein may comprise similar materials. In an embodiment, a first end 115 of the first wire conductive structure 116 may be attached to a top surface of the second die 110. A second end 117 of the first wire conductive structure 116 may be attached/bonded to the interposer 112. In an embodiment the first wire conductive structure 116 may comprise a conductive wire, wherein the first end 115 and the second end 117 of the conductive wire may be bonded onto the second die 110 and onto the interposer 112, respectively. In an embodiment, the first wire conductive structure 116 may extend from the second die 110 to a top surface of the interposer 112.

In an embodiment, a second wire conductive structure 114 may extend from a top surface of the interposer 112 to a top surface of the board 102. In an embodiment, a first end 119 of the second wire conductive structure 114 may be disposed on a top surface of the interposer 112, and a second end 121 of the second wire conductive structure 114 may be disposed on a top surface of the board 102. In an embodiment, the first end 119 of the second wire conductive structure 114 may be adjacent the second end 117 of the first wire conductive structure 116 on the top surface of the second die 110 in an embodiment, a third wire conductive structure 118 may extend from a top surface of the top die 112 to a top surface of the board 102. In an embodiment, the third wire conductive structure 118 may be disposed on the top surface of the second die 110, wherein the first end 115 of the first wire 116 is disposed on an opposite side of the top surface of the second die 110.

In an embodiment, an edge of the second die 110 may be offset from an edge of the first die 106 by a distance 126. In an embodiment, the second wire conductive structure 114 may be disposed a distance 128 from an edge of the first die 106, and the third wire conductive structure 118 may be disposed a distance 129 from an opposite edge of the first die 106, In an embodiment, since the second die 110 may be less than about half the length of the first die 106, forming/attaching two segments of shorter bonding wire conductive structures 114, 116 that are coupled to the interposer 112 (instead of extending one longer wire from the second die 110 to the board 102) increases the wire conductive structure 114 to first die 106 edge clearance 128. Additionally, the third wire conductive structure 118 edge clearance 129 is enhanced since the second die 110 is shifted/offset from the center 122 of the first die 106. In an embodiment, the package structure 100 comprises a hybrid package, wherein the bottom/first die 106 comprises a flip chip die and the top/second die 110, which may comprise a wire bonded die. In an embodiment, wire sweep is increased between the second die 110 and the board 102, and occurrences of wire shorts and low clearance between board 102 and the second die 110 are decreased.

Figure 1B:
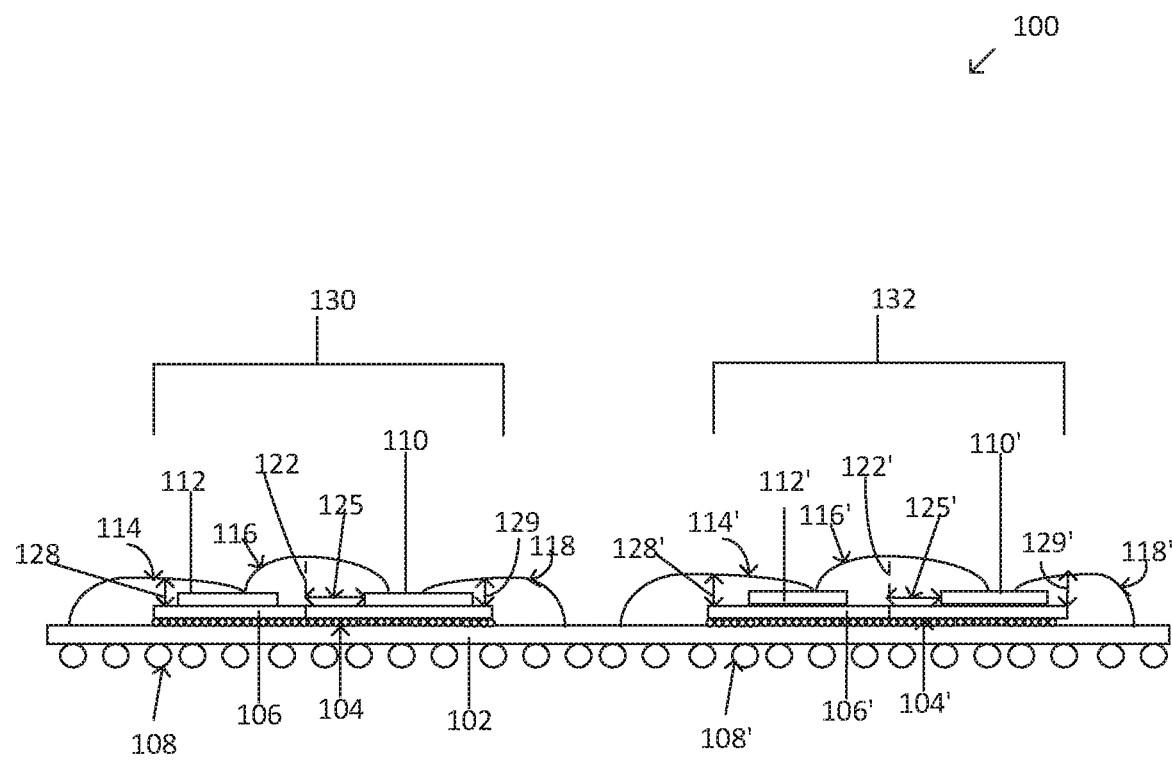

FIG. 1b depicts another embodiment of a package substrate 100, wherein a board 102 comprises two first die 106, 106'. At least one of the first die 106, 106' may comprise a flip chip die in an embodiment, but may comprise other types of devices according to the particular application. Each of the two flip chip die 106, 106' comprise an interposer 112, 112' and an adjacent second die 110, 110' on a top surface of each of the first die 106, 106', respectively. In an embodiment, the board 102 may comprise a first and second module 130, 132 disposed thereon. The first module 130 may comprise the first die 106, with the interposer 112 and the second die 102 disposed adjacent each other on the surface of the first die 106. The second module 132 may comprise the first die 106', with the interposer 112' and the second die 102' disposed adjacent each other on the surface of the first die 106'.

A first wire conductive structure 116 may be disposed/attached to the second die 110 of the first module. In an embodiment, the first wire conductive structure 116 may extend from the second die 110 to a top surface of the interposer 112. In an embodiment, a second wire conductive structure 114 may extend from a top surface of the interposer 112 to a top surface of the board 102, wherein the second wire conductive structure 114 may be adjacent the first wire conductive structure on the top surface of the interposer. In an embodiment, a third wire conductive structure 118 may extend from a top surface of the second die 110 to a top surface of the board 102. In an embodiment, the third wire conductive structure 118 may be adjacent the first wire conductive structure 116 on the top surface of the second die 110.

In an embodiment, the second wire conductive structure 114 of the first module 130 may be disposed a distance 128 from an edge of the first die 106, and the third wire conductive structure 118 may be disposed a distance 129 from an opposite edge of the first die 106. The second module 132 may comprise the first wire conductive structure 116' disposed/attached to the second die 110' of the first module, and extending from the second die 110' to a top surface of the interposer 112'. In an embodiment, the second wire conductive structure 114' may extend from a top surface of the interposer 112' to a top surface of the board 102', wherein the second wire conductive structure 114' may be adjacent the first wire conductive structure 116' on the top surface of the interposer.

In an embodiment, a third wire conductive structure 118' may extend from a top surface of the second die 110' to a top surface of the board 102. In an embodiment, in an embodiment, the third wire conductive structure 118" may be disposed on the top surface of the second die 110', wherein the first end 115' of the first wire conductive structure 116' is disposed on an opposite side of the top surface of the second die 110'. In an embodiment, the second wire conductive structure 114' may be disposed a height 128' from an edge of the first die 106', and the third wire conductive structure 118' may be disposed a height 129' from an edge of the first die 106'. In an embodiment a footprint (such as footprint 124 of FIG. 1*a*) of the second die 110, 110' may be offset by distances 125, 125' from the center locations 122, 122' of the first die 106, 106' respectively. In an embodiment, the first die 106' may be described as a third die disposed on the board 102, wherein a second interposer 112' and a fourth die (second die 110') are disposed adjacent to each other on a top surface of the third die.

Figure 1C:
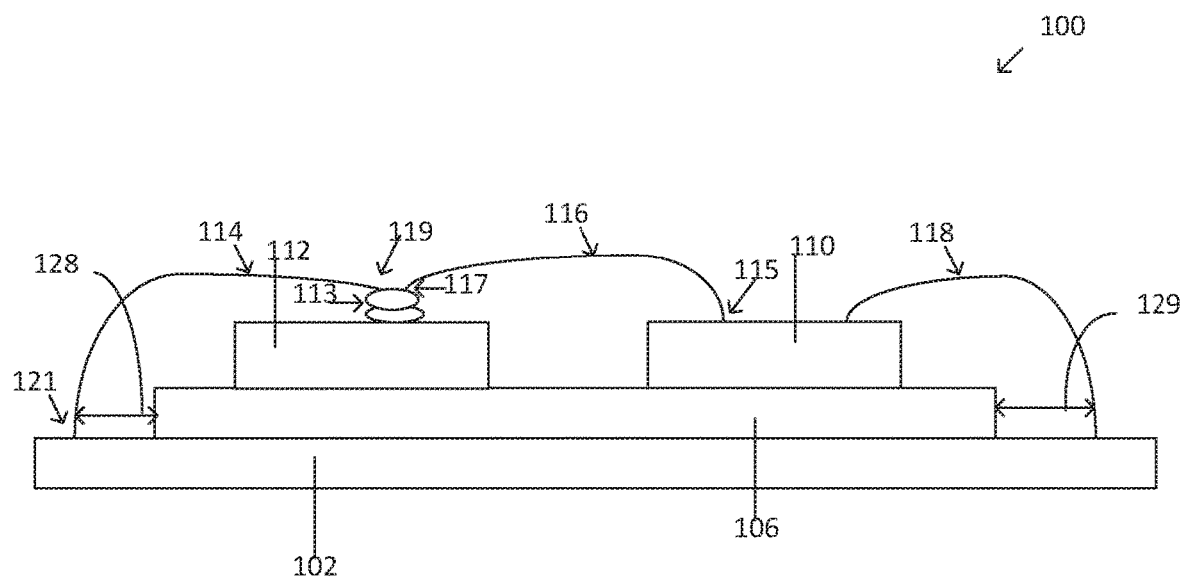

FIG. 1*c* depicts a portion of a package structure 100. A first die 106 may be disposed on a board 102, and an interposer 112 and a second die 110 are disposed on a top surface of the first die 106. A first wire conductive structure 116 extends from the second die 110 to a top surface of the interposer 112, wherein a first end 115 of the first wire conductive structure 116 may be coupled to a top surface of the second die 110 (wherein the first end 115 may be bonded to a bond pad on the top surface of the second die 110), and a second end 117 of the first wire conductive structure 116 may be coupled to a bond structure 113 that is disposed on the interposer 112. A first end 119 of a second wire conductive structure 114 may be coupled to the bond structure 113, wherein first and second wire conductive structures 116, 114 are coupled to each other by a cascade bonding structure 113, in an embodiment. Other suitable types of bonding may be used to physically and electrically coupled the first and second wire structures 116, 114 on the interposer 112, according to the particular application.

In an embodiment, the two forward bonding structure 113 may comprise two bond structures disposed/stacked on top of each other on the top surface of the interposer 112. A second end 121 of the second wire conductive structure 114 may extend form the interposer 112 to the board 102, and may be physically and electrically coupled thereto. A third wire conductive structure 118 may extend from a top surface of the second die 110 and may be coupled to the board 102, Edge clearances 128, 129 may separate the second and third wire conductive structures 114, 118 from the edge of the first die 106, respectively.

Figure 1D:
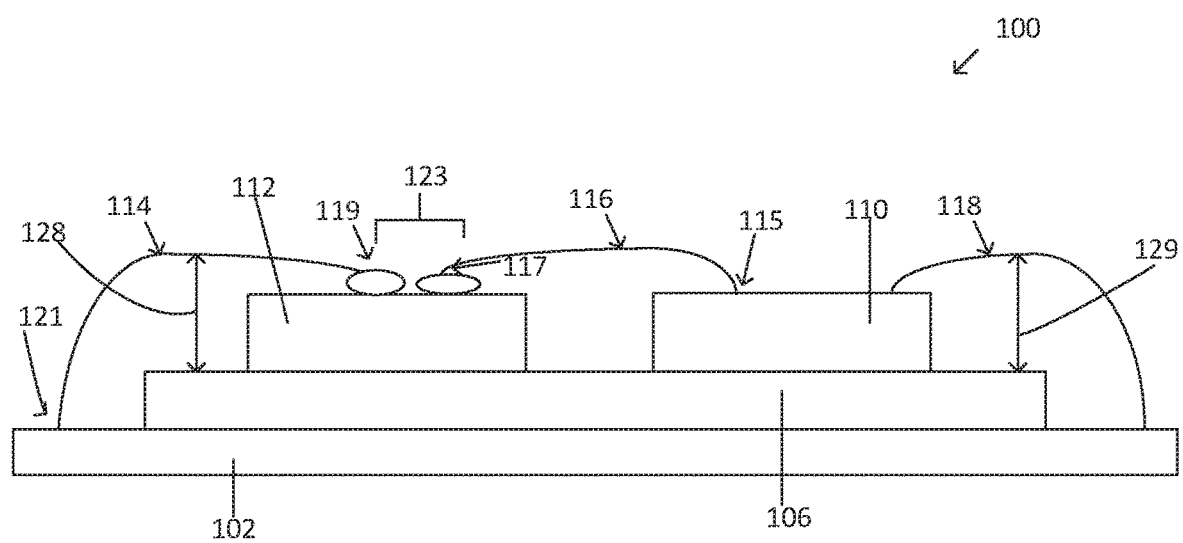

FIG. 1*d* depicts a portion of portion of a package structure 100. A first die 106 is disposed on a board 102, and an interposer 112 and a second die 110 are disposed on a top surface of the first die 106. A first wire conductive structure 116 extends from the second die 110 to a top surface of the interposer 112. In an embodiment, a first end 115 of the first wire conductive structure 116 may be coupled to a top surface of the second die 110, and a second end 117 of the first wire conductive structure 116 may be coupled to a bond structure 123 that is disposed on the interposer 112. A first end 119 of a second wire conductive structure 114 may be coupled to the bond structure 123, wherein first and second wire conductive structures 116, 114 are coupled to each other by a two forward wire bond structure 123, in an embodiment.

In an embodiment, the two forward bonding structure 123 may comprise two bond structures disposed adjacent each other on the top surface of the interposer 112. A second end 121 of the second wire conductive structure 114 may extend from the interposer 112 to the board 102, and may be physically and electrically coupled thereto, by a bond pad, for example. A third wire conductive structure 118 may extend from a top surface of the second die 110 and may be coupled to the board 102.

Figure 2:
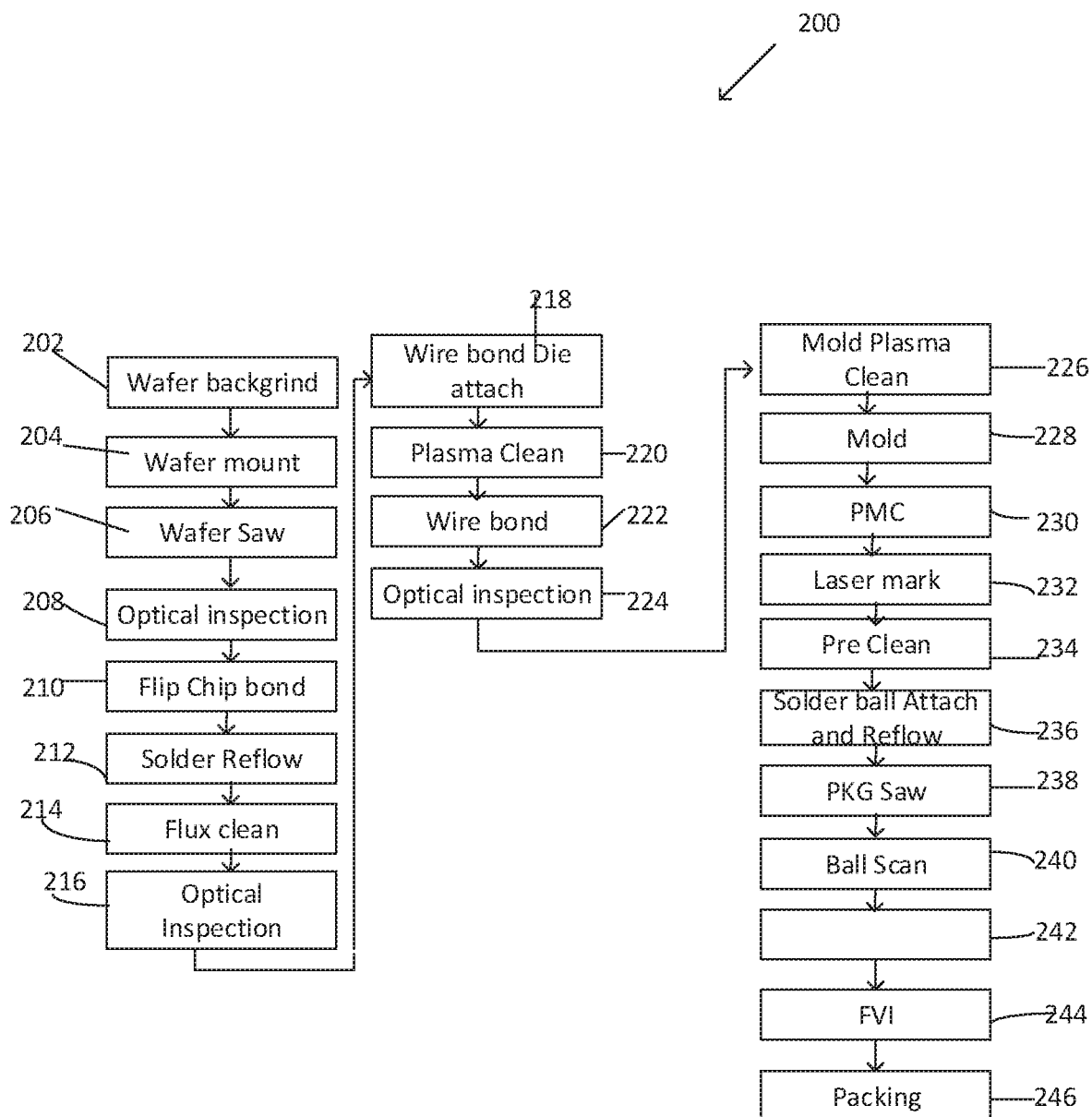
FIG. 2 represents a process flow according to embodiments.

FIG. 2 depicts a process flow 200 for fabricating the package structure, such as the package structure 100 of FIG. 1, for example, according to embodiments. At step 202, a wafer, such as a silicon wafer, may be expose to a backgrinding process. At steps 204-206, the wafer may be mounted and wafer sawed into separate die. At steps 208-210, the separated die may be optically inspected and flip chip bonded onto a substrate, such as onto a board. At steps 212-214, the die may be solder bump reflowed and flux cleaned. At step 216-218, the die may be optically inspected and a second die may be wire bonded and die attached onto a top surface of the flip chip. An interposer may be die attached and wire bonded onto the top surface of the flip chip as well. At steps 220-224 a pre wire bond plasma may be applied, and additional wire bonding and a third optical inspection may take place. In an embodiment, the steps 202-224 may comprise front of the line (FOL) process steps.

At steps 226-228, a mold plasma clean may be performed on the package structure prior to applying mold to the package. At steps 230-232, PMC (post mold curing) and laser marking may be performed. At steps 234-236, pre-clean and solder ball attach and solder reflow may be performed. At steps 238-240, package saw and ball scan may be performed, and at step 242-246 final visual inspection and packaging and shipping may be performed.

The various embodiments of the package assemblies/structures described herein enable improved wire sweep performance due to a shorter wire length of each segment attached to the interposer. The wire attached to the bottom/flip chip die from the added interposer structure comprises a greater edge clearance which minimizes the risk of electrical leakage. Consequently, assembly yield and test yield will be improved due to deceased failure from shorts and leakage, for example. By shifting a smaller top die of the package structure away from a center region of a larger bottom die, the wire length from the top die to the board is decreased. Improves both assembly and test yield for product design.

Figure 3:
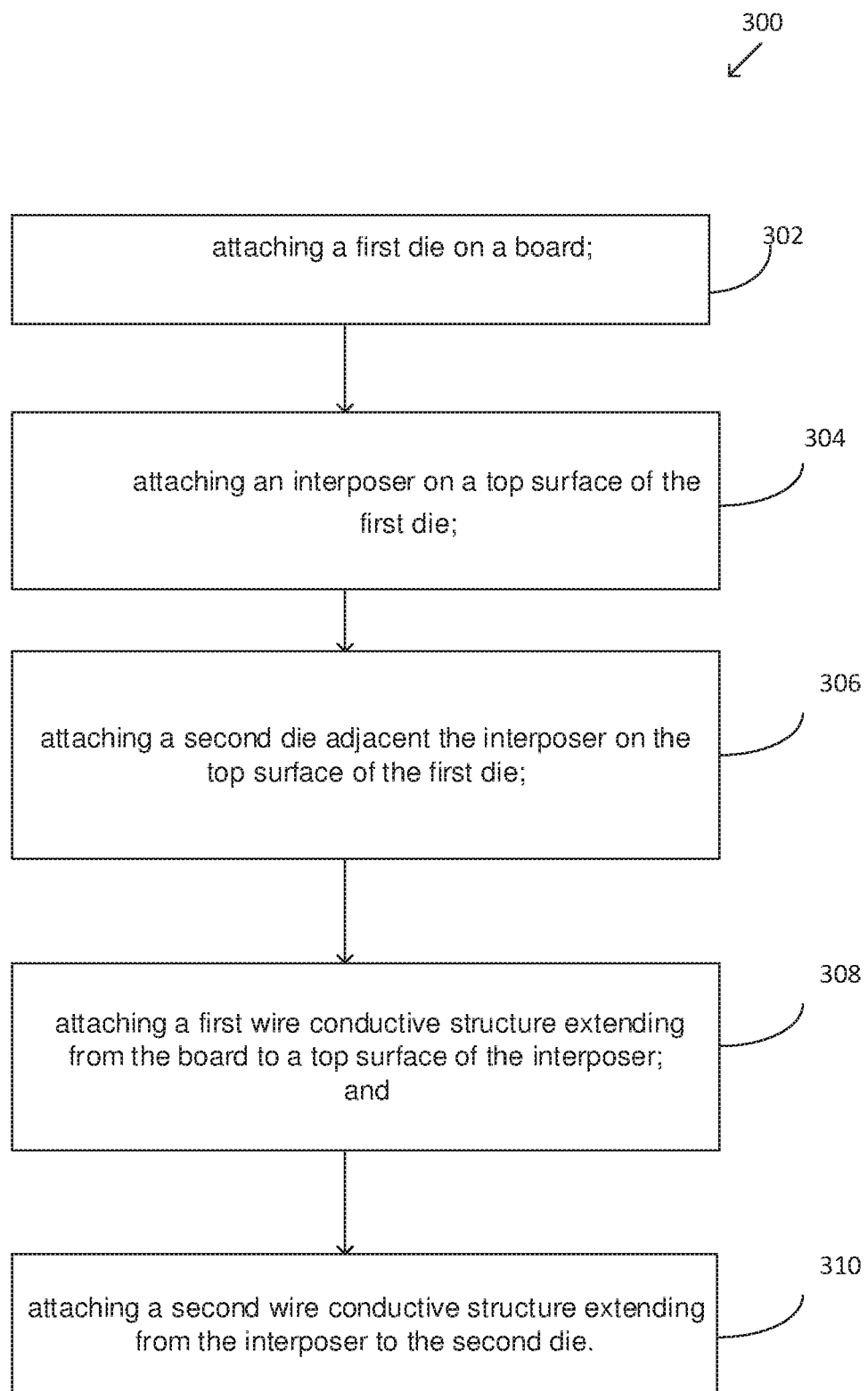
FIG. 3 represents a flow chart of a method according to embodiments.

FIG. 3 depicts a method 300 of forming a package structure according to embodiments herein. At step 302, a first die may be attached on a board. In an embodiment, the first die may comprise a flip chip die, and the board may comprise a motherboard. At step 304, an interposer may be attached on a top surface of the first die. In an embodiment, the interposer may comprise a silicon interposer, and may be offset from a center portion of the first die.

At step 306, a second die may be attached adjacent the interposer on the top surface of the first die. In an embodiment, the first die may comprise a length greater than about twice a length of the second die. In an embodiment the second die may be offset from a center portion/point of the first die. At step 308, a first wire conductive structure may be attached extending from the board to a top surface of the interposer. At step 310, a second wire conductive structure may be attached extending from the interposer to the second die. In an embodiment, the first and second wire conductive structures may be physically and electrically coupled onto a bond structure/bond pad disposed on a top surface of the interposer. In an embodiment, a third wire may be attached to the interposer, and may comprise a wire bonding from a board lead/pad to an interposer bond pad.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external device/layers. In some embodiments the structures may further comprise a plurality of dies, which may be stacked upon one another, depending upon the particular embodiment. In an embodiment, the dies) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 4:
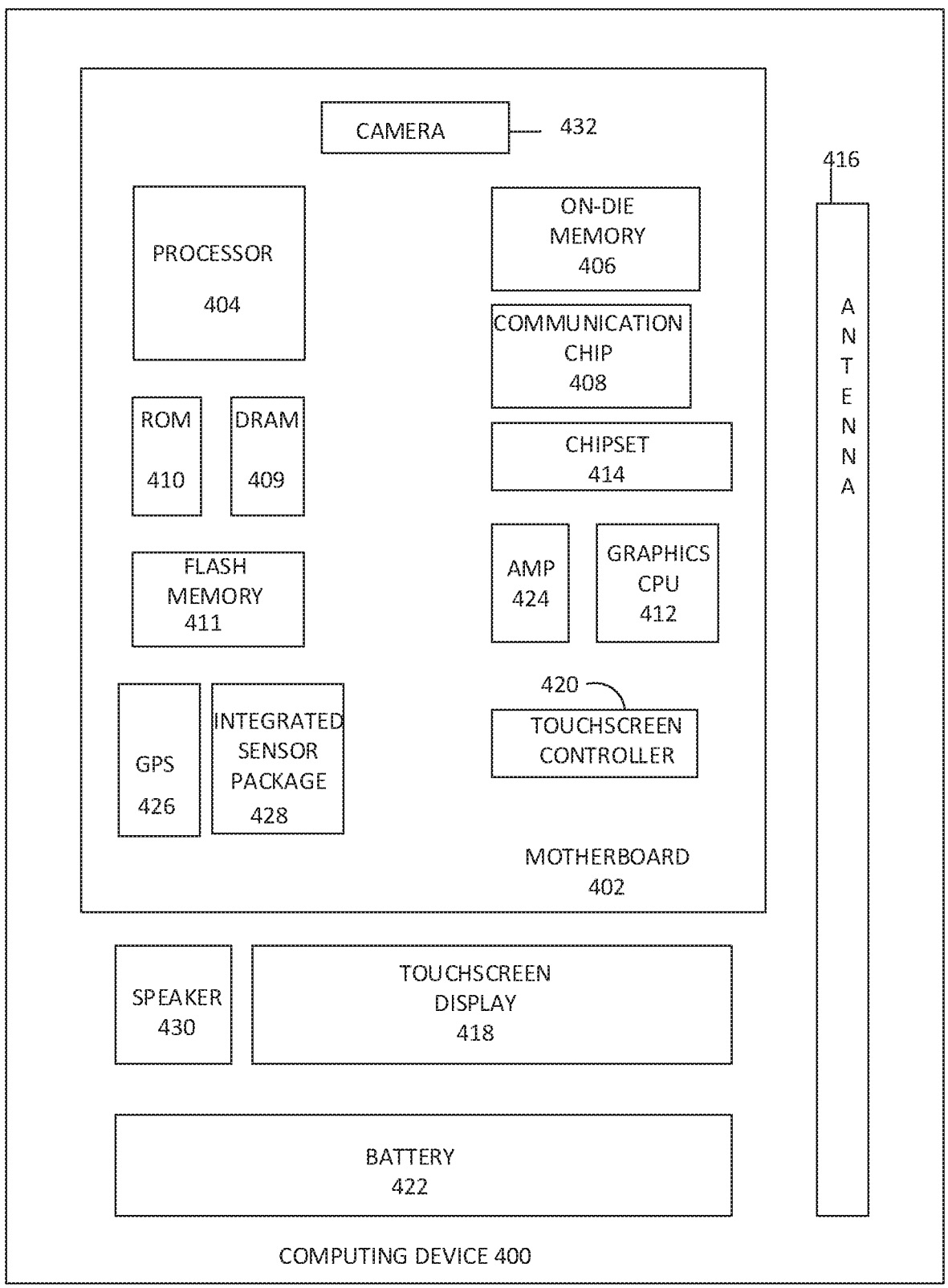
FIG. 4 represents a schematic of a computing device according to embodiments.

FIG. 4 is a schematic of a computing device 400 that may be implemented incorporating embodiments of the package structures described herein. For example, any suitable ones of the components of the computing device 400 may include, or be included in, a package structure, such as package structure 100 of FIG. 1*a*, for example, in accordance with any of the embodiments disclosed herein. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory 411, a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, a speaker 430, a camera 432, compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, COMA, TDMA, DECT, Bluetooth, Ethernet derivatives thereof, as well as any other wireless and wired protocols that are designated as 3G, 4G, 5G, and beyond. The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, COMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising a first die on a first side of a substrate, an interposer on a second side of the first die, a second die on the second side of the first die, wherein the second die is adjacent the interposer, a first wire conductive structure, wherein a first end of the first wire is disposed on the second die, and a second end of the first wire conductive structure is disposed on the interposer; and a second wire conductive structure, wherein a first end of the second wire conductive structure is disposed on the interposer and is adjacent the second end of the first wire conductive structure, wherein a second end of the second wire conductive structure is disposed on the substrate.

Example 2 includes the microelectronic package structure of example 1 wherein the first end of the second wire conductive structure and the second end of the first wire conductive structure are physically coupled to a bond connection structure disposed on the top side of the interposer.

Example 3 includes the microelectronic package structure of example 1 wherein a footprint of the interposer is offset by a distance from a center point of the first die.

Example 4 includes the microelectronic package structure of example 1 wherein the first die comprises a flip chip die.

Example 5 includes the microelectronic package structure of example 1 wherein at the second die comprises a memory die.

Example 6 includes the microelectronic package structure of example 1 wherein a footprint of the first memory device is not substantially offset from a footprint of the microelectronic device.

Example 7 includes the microelectronic package structure of example 1 wherein a length of the first die is greater than about twice a length of the second die.

Example 8 includes the microelectronic package structure of example 1 wherein a footprint of the second die is offset by a distance from a center point of the first die.

Example 9 is a microelectronic package structure comprising a board, a first die on the board, an interposer on a top surface of the first die, a second die on the top surface of the first die that is adjacent the interposer, wherein a footprint of the second die is offset from a center region of the first die. A first wire conductive structure extends from the second die and is attached to a top surface of the interposer, and a second wire conductive structure extending from the interposer and attached to the board.

Example 10 includes the microelectronic package structure of example 9 wherein the first and second wire conductive structures are physically and electrically coupled to each other on the interposer.

Example 11 includes the microelectronic package structure of example 10 wherein a first end of the first wire conductive structure is bonded to a bond pad disposed on a peripheral region of a top surface of the second die.

Example 12 includes the microelectronic package structure of example 9 wherein a third wire conductive structure extends from the second die to the board.

Example 13 includes the microelectronic package structure of example 9 wherein a third die is disposed on the board, wherein a second interposer and a fourth die are disposed adjacent to each other on a top surface of the third die.

Example 14 includes the microelectronic package structure of example 13 wherein a fourth wire conductive structure extends from the fourth die and is attached to a top surface of the second interposer.

Example 15 includes the microelectronic package structure of example 14 wherein a fifth wire conductive structure extends from the second interposer and is attached to the board.

Example 16 includes the microelectronic package structure of example 9, wherein a footprint of the interposer is offset from a center region of the first die wherein the interposer.

Example 17 is a method of forming a microelectronic package structure, comprising: attaching a first die on a board, attaching an interposer on a top surface of the first die, attaching a second die adjacent the interposer on the top surface of the first die, attaching a first wire conductive structure extending from the board to a top surface of the interposer, and attaching a second wire conductive structure extending from the top surface of the interposer to a top surface of the second die.

Example 18 includes the method of forming the microelectronic package structure of example 17 wherein the first conductive wire structure and the second wire conductive structure are physically and electrically bonded to a bond pad on a top surface of the interposer.

Example 19 includes the method of forming the microelectronic package structure of example 17 wherein the second die comprises a footprint that is offset from a center portion of the first die.

Example 20 includes the method of forming the microelectronic package structure of example 17 wherein the first die comprises a flip chip die.

Example 21 includes the method of forming the microelectronic package structure of example 20 further comprising wherein the first die comprises a length greater than about twice a length of the second die.

Example 22 includes the method of forming the microelectronic package structure of example 17 further comprising attaching a third wire conductive structure from the second die to the board.

Example 23 includes the method of forming the microelectronic package structure of example 17 further comprising attaching a fourth wire conductive structure from the second die to the board.

Example 24 includes the method of forming the microelectronic package structure of example 17 wherein the microelectronic package comprises a hybrid package structure.

Example 25 includes the method of forming the microelectronic package structure of example 17 wherein the microelectronic package structure comprises a portion of a mobile device.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a microelectronic package structure, comprising:
   attaching a first die on a board;
   attaching an interposer on a top surface of the first die;
   attaching a second die adjacent the interposer on the top surface of the first die;
   attaching a first wire conductive structure extending directly from the board to a top surface of the interposer; and
   attaching a second wire conductive structure extending from the top surface of the interposer to a top surface of the second die, wherein the first wire conductive structure and the second wire conductive structure are physically and electrically bonded to a common bond connection structure on a top surface of the interposer.

2. The method of claim 1, wherein the second die comprises a footprint that is offset from a center portion of the first die.

3. The method of claim 1, wherein the first die comprises a flip chip die.

4. The method of claim 1, wherein the first die comprises a length greater than twice a length of the second die.

5. The method of claim 1, further comprising attaching a third wire conductive structure from the second die to the board.

6. The method of claim 5, further comprising attaching a fourth wire conductive structure from the second die to the board.

7. The method of claim 1, wherein the microelectronic package structure comprises a hybrid package structure.

8. The method of claim 1, wherein the microelectronic package structure comprises a portion of a mobile device.

9. A method of fabricating a microelectronic package structure, the method comprising:
   coupling a first side of a first die to a first side of a printed circuit board substrate;
   coupling an interposer to a second side of the first die, the second side opposite the first side;
   coupling a second die to the second side of the first die, wherein the second die is adjacent the interposer;
   coupling a first wire conductive structure to the second die and to the interposer, wherein a first end of the first wire is coupled to the second die, and a second end of the first wire conductive structure is coupled to the interposer; and
   coupling a second wire conductive structure to the interposer and to the printed circuit board substrate, wherein a first end of the second wire conductive structure is physically and electrically bonded to a common bond connection structure on the top side of the interposer to which the second end of the first wire is physically and electrically bonded, and wherein a second end of the second wire conductive structure is coupled directly to the printed circuit board substrate.

10. The method of claim 9, wherein a footprint of the interposer is offset by a distance from a center point of the first die.

11. The method of claim 9, wherein the first die comprises a flip chip die.

12. The method of claim 9, wherein the second die comprises a memory die.

13. A microelectronic package structure comprising:
   a first die having a first side on a first side of a printed circuit board substrate;
   a first interposer on a second side of the first die, the second side opposite the first side;
   a second die on the second side of the first die, wherein the second die is adjacent the first interposer;
   a first wire conductive structure, wherein a first end of the first wire is disposed on the second die, and a second end of the first wire conductive structure is disposed on the first interposer;
   a third die having a first side on the first side of the printed circuit board substrate; a second interposer on a second side of the third die, the second side opposite the first side;
   a fourth die on the second side of the third die, wherein the fourth die is adjacent the second interposer;
   a second wire conductive structure, wherein a first end of the second wire is disposed on the fourth die, and a second end of the second wire conductive structure is disposed on the second interposer; and
   a third wire conductive structure, wherein a first end of the third wire conductive structure is disposed on the first interposer and is physically and electrically bonded to a common bond connection structure on the first interposer to which the second end of the first wire is physically and electrically bonded, wherein a second end of the third wire conductive structure is disposed directly on the printed circuit board substrate.

14. The microelectronic package structure of claim 13, further comprising:
   a fourth wire conductive structure, wherein a first end of the fourth wire conductive structure is disposed on the second interposer and is adjacent the second end of the second wire, wherein a second end of the fourth wire conductive structure is disposed directly on the printed circuit board substrate.

15. The microelectronic package structure of claim 13, wherein the second die comprises a first memory die, and the fourth die comprises a second memory die.

16. The microelectronic package structure of claim 13, wherein a length of the first die is greater than twice a length of the second die, and wherein a length of the third die is greater than twice a length of the fourth die.

17. The microelectronic package structure of claim 13, wherein the microelectronic package structure comprises a hybrid package structure.

18. The microelectronic package structure of claim 13, wherein a footprint of the second die is offset by a distance from a center point of the first die, and wherein a footprint of the fourth die is offset by a distance from a center point of the third die.

19. The microelectronic package structure of claim 13, wherein a footprint of the first interposer is offset by a distance from a center point of the first die, and wherein a footprint of the second interposer is offset by a distance from a center point of the third die.

* * * * *